United States Patent
Honkanen et al.

(10) Patent No.: US 6,380,875 B2
(45) Date of Patent: Apr. 30, 2002

(54) DIGITAL RAMP GENERATOR WITH OUTPUT POWER LEVEL CONTROLLER

(75) Inventors: Mauri Honkanen, Tampere; Jouko Vankka, Helsinki, both of (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/921,210

(22) Filed: Aug. 2, 2001

Related U.S. Application Data

(63) Continuation-in-part of application No. PCT/FI00/01065, filed on Dec. 1, 2000.

(30) Foreign Application Priority Data

Dec. 3, 1999 (FI) .............................. 19992614

(51) Int. Cl.[7] .............................. H03M 1/66; H03K 4/90
(52) U.S. Cl. ...................... 341/144; 327/133; 368/678; 348/571
(58) Field of Search ................................ 341/144, 166, 341/120, 155, 157; 365/185.03; 348/465, 571; 327/133, 156, 115; 368/678; 375/243; 342/185

(56) References Cited

U.S. PATENT DOCUMENTS

| | | | |
|---|---|---|---|
| 3,765,018 A | * 10/1973 | Heard et al. | 342/185 |
| 3,886,459 A | * 5/1975 | Hufford et al. | 327/115 |
| 4,503,396 A | 3/1985 | Fawkes | |
| 4,630,188 A | 12/1986 | Daggett | |
| 4,675,614 A | * 6/1987 | Gehrke | 327/156 |
| 4,736,189 A | * 4/1988 | Katsumata et al. | 341/120 |
| 4,757,392 A | * 7/1988 | Awamoto et al. | 348/571 |
| 4,773,096 A | * 9/1988 | Kirn | 381/120 |
| 4,973,959 A | * 11/1990 | Kobari et al. | 375/243 |
| 5,138,552 A | * 8/1992 | Weedon et al. | 341/157 |
| 5,317,401 A | * 5/1994 | Dupont et al. | 368/678 |
| 5,347,176 A | * 9/1994 | Bloom | 327/133 |
| 5,486,865 A | * 1/1996 | James | 348/465 |
| 5,774,390 A | 6/1998 | Tailliet | |
| 5,886,660 A | * 3/1999 | Loewenstein | 341/166 |
| 5,973,959 A | * 10/1999 | Gerna et al. | 365/185.03 |

FOREIGN PATENT DOCUMENTS

| | | |
|---|---|---|
| DE | 19523693 | 5/1998 |
| JP | 1073808 | 7/1989 |

OTHER PUBLICATIONS

B. Baggini, G.Caiulo and F. Maloberti; "Waveform Shaping For GSM Systems", IEEE, 1996.
B. Baggini, G.Caiulo and F. Maloberti; "Title Raised Cosine Waveform Shaper For GSM Base Station", ESSCIRC, 1995, abstract only.
J. Bayard; "Very Low Frequency Quadrature Oscillator", Review of Scientific Instruments, 2000, abstract only.
International Search Report for PCT/FI00/01065.

* cited by examiner

*Primary Examiner*—Peguy Jeanpierre
*Assistant Examiner*—Jean Bruner Jeanglaude
(74) *Attorney, Agent, or Firm*—Altera Law Group, LLC

(57) ABSTRACT

Simplifying functions representing raised sine or cosine curves to functions representing simple sine or cosine curves makes it possible to implement an electrical equivalent circuit for a ramp generator. The core of the ramp generator with an output power level controller is second-order direct-form feedback structure (60), which forms a digital sinusoidal oscillator. The initial values of two state variables x2(n), x2(n+1) of the oscillator are chosen so that they both contain a predetermined first constant value. This first constant value will emerge as the amplitude value of the pure sine wave generated by the oscillator. Particularly the first constant value is equal to the desired nominal level A of the ramp minus the starting level. A second constant value (A+dc) is added to the oscillator output. The added result is scaled (66) so that the nominal power level is A. A multiplexer (67) keeps the power level between the ramps constant.

14 Claims, 7 Drawing Sheets

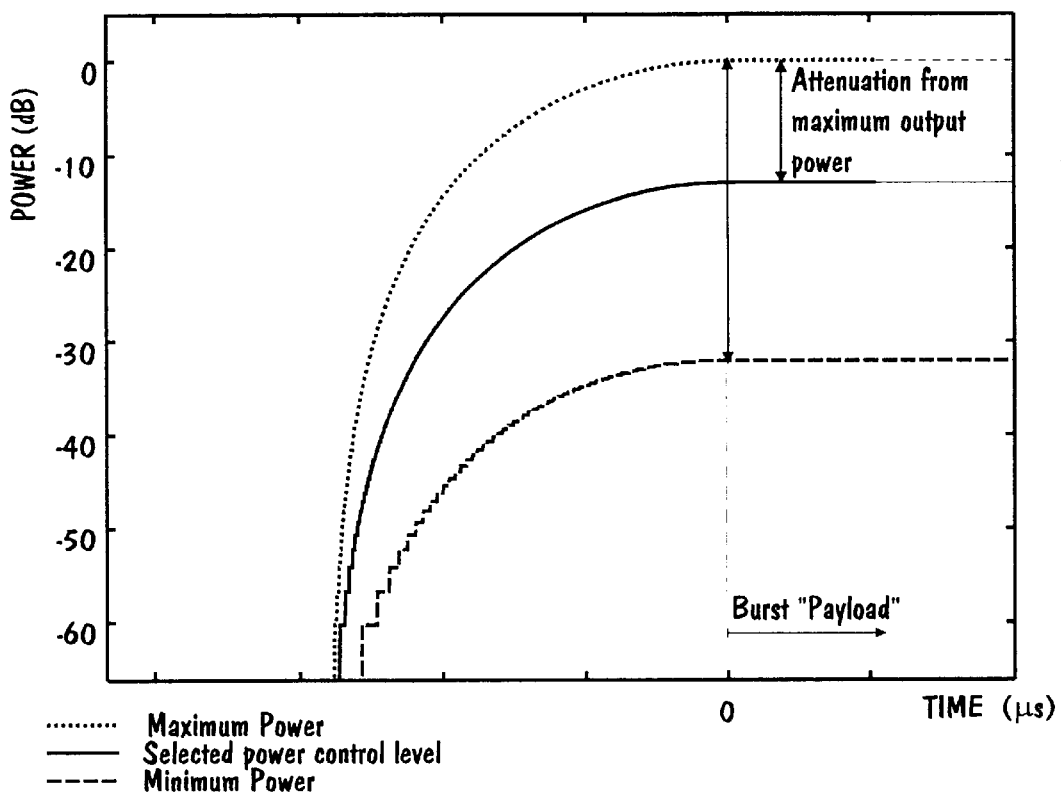
FIG. 1 *prior art*
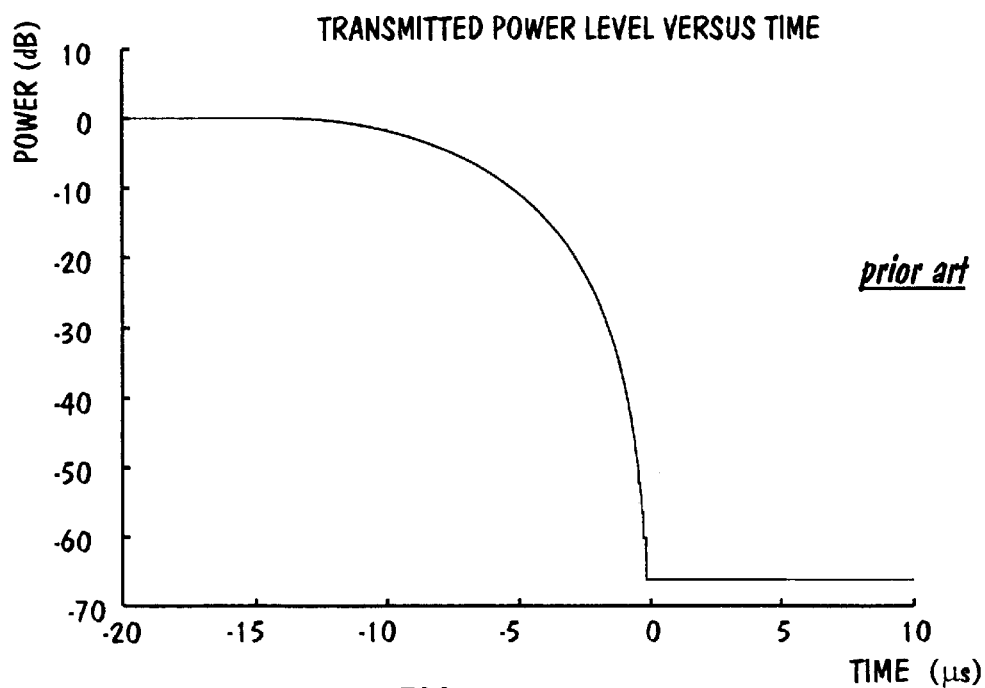
FIG. 2

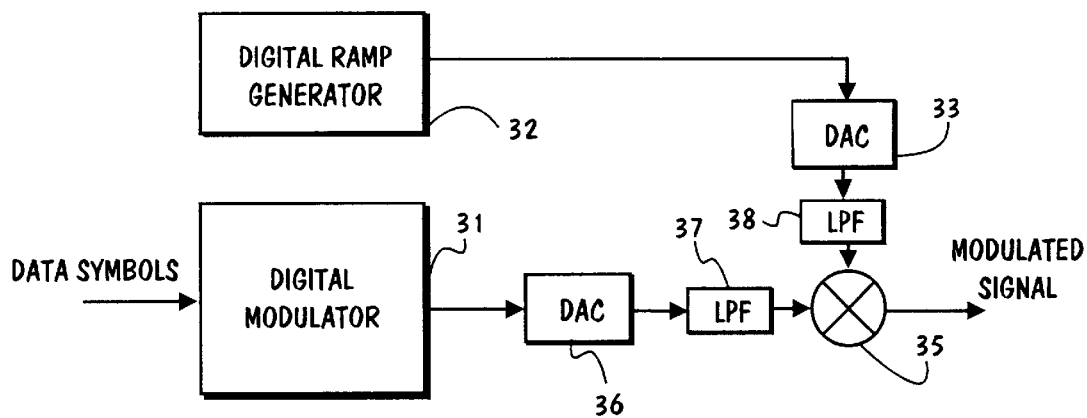
FIG. 3 _prior art_
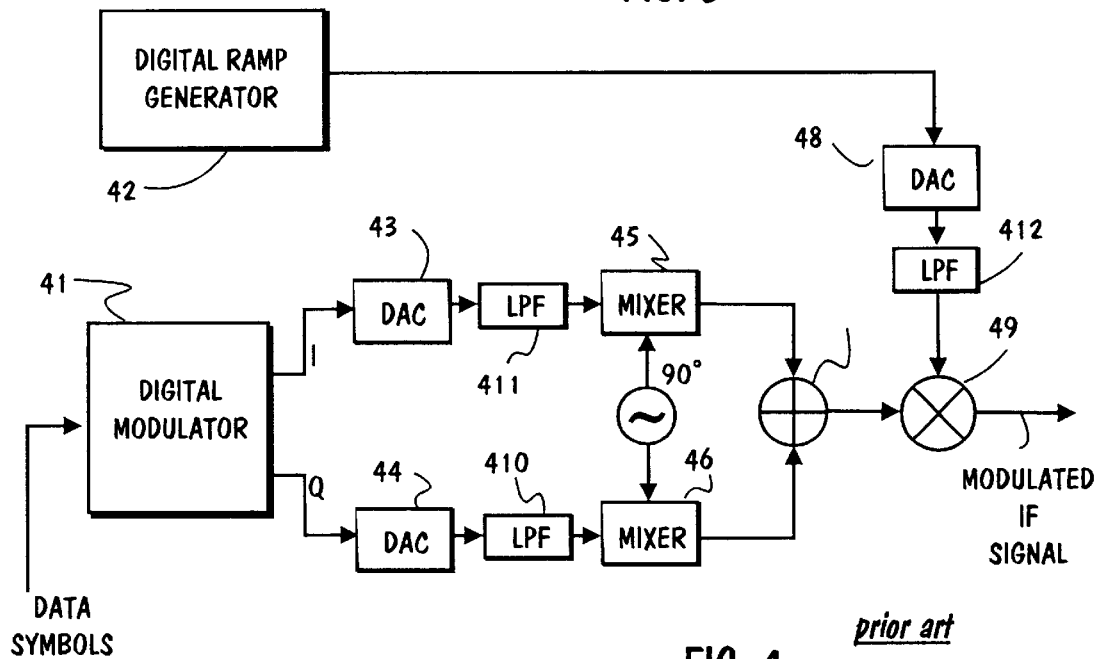
_prior art_
FIG. 4
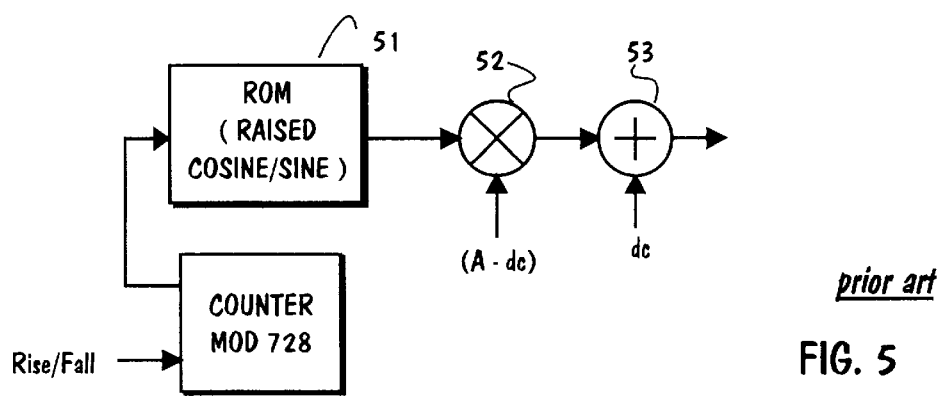
_prior art_
FIG. 5

(a)

(b)

DIGITAL RAMP GENERATOR WITH OUTPUT POWER LEVEL CONTROLLER

This application is a continuation in part of PCT/FI00/01065, filed Dec. 1, 2000, which claims priority from Finnish Serial Number 19992614, filed Dec. 3, 1999.

FIELD OF THE INVENTION

The present invention relates generally to a transmitter of a radio system using burst transmission, and particularly to a ramp generator for shaping the rise and the fall of a burst and for controlling the power level of the burst.

BACKGROUND OF THE INVENTION

A burst is the transmission quantum of numerous digital radio systems based on the principle of time division duplex (TDD), frequency division duplex (FDD), and code division duplex (CDD). The transmission takes place during a short time window. Within this time interval the emission rises from the starting power level to the nominal power level. The signal is then modulated to transmit a packet of bits. After that, the power level decreases until it reaches the minimum power level. The time mask of the burst, during which the bits are transmitted, is called a useful part or a payload part. Modulation is performed in the transmitter analogically or digitally, either at a base band frequency or at an intermediate frequency (IF). The modulated IF signal is then mixed up to the radio transmission frequency.

FIG. 1 depicts the rising portion of the power envelope of a burst comprising a digitally modulated intermediate frequency signal. In this example, during the rise of the burst the envelope should track a raised sine curve. After a predetermined period the power has reached its selected nominal level, whereupon modulation starts. This instant is denoted as 0 in the horizontal time axis. Usually the transmission power is adjustable according to the requirement of the system concerned. For that reason the nominal power level value can vary between the maximum power level and the minimum power level, as shown by the dotted line and the dashed line in FIG. 1. The nominal power level between those levels can usually attain one of several discrete power levels. For example, the downlink dynamic power control in the GSM system uses 16 power levels with 2 dB separations.

FIG. 2 depicts the falling portion of the envelope of a digitally modulated intermediate frequency signal. The signal envelope during the fall of the transmission burst should track a raised cosine curve.

The power level can be controlled burst by burst. Control is realized by scaling the ramp curve which follows the raised sine/cosine curve. Hence, the ramp-up curve starts from the minimum power level, but settles at the level specified by the power level indication as shown in FIG. 1. At the end of the burst the ramp-down curve starts from the nominal power level, but settles at the minimum power level as shown in FIG. 2.

Conventionally, power ramping and control of the output power level are performed in the analog domain. One problem with analog solutions is inaccuracies caused by aging and by variations in operation temperature and components. Furthermore, the analog solutions are complex, and stability is a problem.

Today the tendency is to perform power ramping and output power level control digitally in order to avoid the afore-mentioned problems. Some basic solutions are presented below.

FIG. 3 illustrates in broad outline the formation of a modulated IF signal into a shape as shown in FIG. 1 and FIG. 2. Data symbols arrive at digital modulator 31 that carries out modulation according to the modulation scheme of the system concerned. A ramp generator in block 32 generates the rising and falling edges according to the raised sine/cosine curve and a flat portion between the curves. Digital output signals from the ramp generator and the modulator are then converted to analog signals in digital-to-analog converters 33 and 36: For removing the high frequency sampling components the analog signals are then filtered in low pass filters 37 and 38, whereupon the analog modulated signal is multiplied in analog multiplier 35 by the analog ramp signal in order to smoothen out the rise and fall of the burst. The output from the multiplier is the analog modulated IF signal with ramped power.

FIG. 4 illustrates another digital modulator. Data symbols arrive at digital modulator 41, which carries out modulation according to the modulation scheme of the system concerned and produces I and Q signals. Said signals are then converted into analog signals by DA converters 43 and 44. For removing the high frequency sampling components the analog signals are filtered in low pass filters 410 and 411, whereupon both the analog I signal and the analog Q signal are transformed into an intermediate frequency by mixer 45 and mixer 46, accordingly. After mixing the sum of I signal and Q signal are added up in analog adder 47 to form the sum signal. A ramp generator in block 42 generates the ramp signal, i.e. the rising and falling edges according to the raised sine/cosine curve and the flat portion between them. The digital ramp signal is then converted into an analog signal in converter 48. The high frequency sampling components are filtered in low pass filter 412, whereupon the analog modulated sum signal is multiplied in multiplier 49 by the analog ramp signal in order to smooth out the rise and fall of the IF burst. The output from the multiplier is the analog modulated IF signal.

Common to both prior art solutions described above are the performance of both the modulation and the generation of the ramp signal digitally but conversion of the digital result signals into the analog domain before multiplying. However, there is a tendency in the art to carry out all processes within the digital domain. In order to better understand one possible realization of the digital ramp generator, a short review of the mathematical background is of assistance.

The burst signal can be considered as a product of an original modulated signal m(t) and a periodical switching signal sw(t). The spectrum of the burst signal is the convolution of the spectra of these two signals in the frequency domain.

For rectangular switching, i.e. without raised cosine/sine shaping, formula (1) is valid for frequency response:

$$W(f) = M(f - f_C) * Sw(f) = K \sum_{n=-\infty}^{\infty} M(f - f_C - nf_g) \sin \pi n f_g \frac{\tau}{\pi n f_g \tau} \qquad (1)$$

where
 * denotes convolution,
 $f_c$ is the carrier frequency,
 $f_g$ is the burst gating rate,
 $\tau$ is the burst length and
 K is a proportional constant.

For raised cosine/sine switching, i.e. with raised cosine/sine shaping, formula (2) is valid for frequency response:

$$W(f) = H \sum_{n=-\infty}^{\infty} M(f - f_C - nf_g)(\tau - T_r)\operatorname{sinc}(nf_g(\tau - T_r))\frac{\cos(\pi T_r nf_g)}{1 - (2T_r nf_g)^2} \quad (2)$$

where $T_r$ indicates the ramp duration, and H is proportional constant.

The spectrum of the periodic burst signal consists of infinite numbers of secondary spectral lobes having the same shape as M(f) separated by the burst gating rate $f_g$, and having decreasing amplitudes. Since the secondary spectral lobes resulting from formula (2) decay faster than those resulting from formula (1), the raised cosine/sine switching is used.

The following function is used to smooth out the rise of the burst:

$$(A - dc)\sin\left(\frac{\pi t}{2T_r}\right)^2 + dc, \quad (3)$$

where $T_r$ indicates the ramp duration, t is $[0\ T_r]$,

A is the envelope of the modulated signal, and dc is the dc offset which settles the starting power level in FIG. 1.

The following function (4) is used to smooth out the fall of the burst:

$$(A - dc)\cos\left(\frac{\pi t}{2T_r}\right)^2 + dc. \quad (4)$$

FIG. 5 illustrates a ramp generator and an output power controller known in the art which are based on formulas (3) and (4). The raised sine values of formula (3) or the raised cosine values of formula (4) are stored in the read only memory (ROM) 51. Digital multiplier 52 is used to control the amplitude level, i.e. value (A–dc). Adder 53 sets the dc offset, i.e. the last factor of formulas. The size of the ROM memory is about (fcfk×$T_r$)×outw, where $f_{clk}$ is the digital IF modulator clock frequency (sampling frequency), $T_r$ is the pulse duration and outw is the multiplier input width.

One drawback of this known ramp generator is that due to the high clock frequency in the digital IF modulators, the size of the memory is large. For example, if the clock frequency is 52 MHz and the ramp duration is 14 μs, then the size of the memory is about 728×12 bit. Furthermore, a multiplier is needed as an extra component to set the output power level.

Another possible way to implement the ramp generator and output power controller is to use a FIR-filter (Finite Impulse Response). The number of the FIR filter taps is $f_{clk}\times T_r$, where $f_{clk}$ is the digital IF modulator clock frequency and $T_r$ is the pulse duration. One drawback of filter implementation is that due to the high clock frequency (sampling frequency) in the IF modulators, there are many taps in the FIR. Therefore, the realization of raised sine and cosine functions with filters is complex. For example, with the above mentioned values, i.e. the clock frequency is 52 MHz and the ramp duration is 14 μs, the number of the FIR filter taps is 728.

SUMMARY OF THE INVENTION

One objective of the present invention is to devise a digital ramp generator with an output power controller that is easy to implement and which requires a minimum number of standard components, without the need for raised sine and cosine memories or digital filters.

A further objective is to devise a digital ramp generator with an output power controller generating a digital output signal that can directly multiply the digital modulated signal produced by a digital modulator.

Yet a further objective is to devise a digital ramp with inherent power control, wherein the generator and power control form a functionally inseparable integrated unit.

The present invention is based on a further mathematical explication of the raised sine and cosine curves representing the rise and fall of the burst. Simplifying functions representing raised sine/cosine curves to functions representing simple sine/cosine curves makes it possible to implement an electrically equivalent circuit consisting of a few simple basic components while tracking the raised sine and cosine functions well.

The core of the electrical equivalent circuit functioning as a ramp generator with an output power level controller is a second-order direct-form feedback structure forming a digital sinusoidal oscillator. The structure is well-known as such, and it produces an output sequence which is the sampled version of the pure sine wave with an amplitude value. The initial values of two state variables of the oscillator are chosen so that they both contain a predetermined first constant value. This first constant value will emerge as the amplitude value of the pure sine wave generated by the oscillator. Particularly the first constant value is equal to the desired nominal level A of the ramp minus a dc offset, where the dc determines the starting power level of the rising ramp and the settling power level after the falling ramp. The dc offset may also be called as a base level.

A second constant value equal to the desired nominal level of the ramp plus the above-mentioned dc offset is added to the oscillator output. Due to the deliberately chosen first and second constant values, the adding operation causes the rising ramp to start from level 2·dc and to end at level 2·A. Accordingly, the adding operation causes the falling ramp to start from level 2·A and to end at level 2·dc.

Finally, the result will be scaled so that the nominal power level will be A, and the starting level of the rising ramp and the end level of the falling ramp will be dc.

After the ramp has risen to the predetermined nominal power level, the output power level will be kept constant up to the instant when the ramp starts falling.

The proposed digital ramp generator and power controller can be implemented with the aid of two two-input adders, two delays, a multiplexer, and a fixed multiplier, which can be constructed with (N−1) adders, where N is the number of non-zero bits in the coefficient. The proposed ramp generator and output power controller saves hardware compared to the conventional methods. Furthermore, since the proposed ramp generator and output power level controller needs neither a memory nor a multiplier, it can be easily implemented with standard cells.

BRIEF DESCRIPTION OF THE DRAWINGS

The invention is described more closely with reference to the accompanying drawings, in which FIG. 1 shows the rising ramp of a burst;

FIG. 2 shows the falling ramp of a burst;

FIG. 3 illustrates a prior art modulator and ramp generator;

FIG. 4 depicts another prior art modulator and ramp generator;

FIG. 5 shows a prior art digital ramp generator;

DETAILED DESCRIPTION OF THE INVENTION

The mathematical background of the invented ramp generator is founded on further development of known formulas for raised cosine and sine functions.

Using trigonometric identities, the previously presented function (3), which is used for smoothing out the rise of the burst, can be rearranged as follows:

$$\frac{1}{2}\left((A+dc)+(A-dc)\cos\left(\frac{\pi t}{T_r}+\pi\right)\right) \qquad (5)$$

At the time instant t=0 the value of the function is dc, and at the end of ramp. time $T_r$ the value of the function is A. Hence, dc is the offset value which settles the starting power level, and A is the power level which the ramp reaches at the end (see FIG. 1). Therefore, the setting of the output power level of the ramp generator, i.e. the nominal power level of the burst, can be done by controlling the value of A. It is essential to note that in equation (5) the cosine term is not raised, so it can be implemented by a sinusoidal oscillator.

Accordingly, using trigonometric identities, function (4), which is used for smoothing out the fall of the burst, can be rearranged as follows:

$$\frac{1}{2}\left((A+dc)+(A-dc)\cos\left(\frac{\pi t}{T_r}\right)\right), \qquad (6)$$

At the time instant t=0 when the ramp begins to fall, the value of the function is A, and at the end of ramp time $T_r$ the value of the function is dc. Hence, dc is the offset value which settles the power level after the ramp, and A is the power level from which the ramp begins to fall (see FIG. 1). Also in this equation the cosine term is not raised, so it can be implemented by a sinusoidal oscillator.

Figure 6:
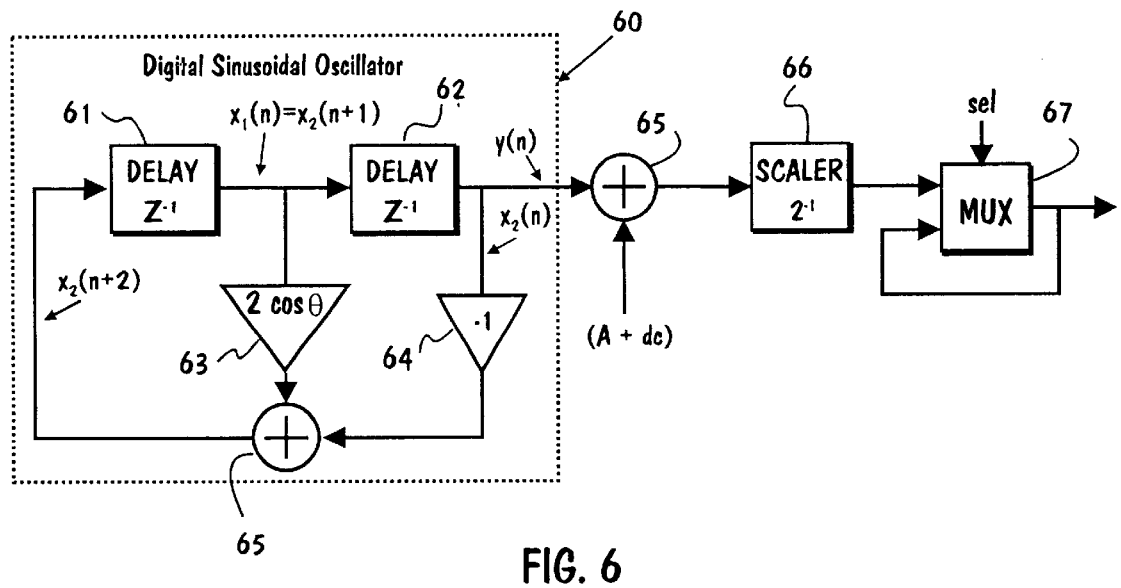
FIG. 6 is a block diagram of the invented ramp generator.

FIG. 6 depicts a ramp generator with an output power level controller which realizes the above-mentioned formulas (5) and (6). The circuit consists of the digital sinusoidal oscillator 60, adder 68, scaler 66, and MUX 67.

The core of this structure, the digital sinusoidal oscillator 60, is a second-order direct-form feedback structure known as such. It produces the cosine term of equations (5) and (6) and amplitude A−dc of the cosine term. Adder 68 adds the constant value A+dc to the oscillator output.

Operation of the oscillator will now be described in more detail by explaining the mathematical basis of the operation of the oscillator with reference to the circuit elements in FIG. 6.

Digital sinusoidal oscillator 60 producing the cosine term of formulas (5) and (6) is implemented by the following second-order difference equation:

$$x_2(n+2)=\alpha x_2(n+1)-x_2(n). \qquad (7)$$

FIG. 6 shows the signal flow graph of the second-order direct-form feedback structure with state variables $x_1(n)$ and $x_2(n)$. State variable $x_1(n)$ is the input to delay block 62, and state variable $x_2(n)$ is the output from that block. Delay block 62 can be implemented with registers. As shown, state variable $x_1(n)$ is also applied to block 63, which multiplies it by the coefficient $\alpha$, whereas state variable $x_2(n)$ is applied to block 64, which takes negation from input signal, i.e. multiplies it by the coefficient −1. The outputs from blocks 63 and 64 are fed to the two-input adder 65. The added result, which is the right-hand part of equation 7, is then applied to delay block 61, which can be implemented with registers. The added result is denoted as $x_2(n+2)$ in FIG. 6.

As shown in the figure, the two state variables are related by the equation:

$$x_1(n)=x_2(n+1) \qquad (8)$$

Solving the one-sided z transform of equation (7) for $x_2(n)$ leads to formula $$X_2(z) = \frac{(z^2 - \alpha z)x_2(0) + zx_1(0)}{z^2 - \alpha z + 1}, \qquad (9)$$

where $x_1(0)$ is the initial value of state variable $x_1(n)$, i.e. the input to delay block 62, and $x_2(0)$ is the initial value of state variable $x_2(n)$, i.e. the output from delay block 62.

Identifying the second state variable as output variable $$y(n)=x_2(n), \qquad (10)$$

as shown in FIG. 6, and choosing the denominator coefficient $\alpha$ to be $$\alpha=2\cos\theta_0,\ \theta_0=\omega_0 T=2\pi f_0/f_{clk}, \qquad (11)$$

where $f_0$ is the oscillator frequency and $f_{clk}$ is the sampling frequency, and choosing the initial values of the state variables to be $$x_1(0)=A*\cos\theta_0,\ x_2(0)=A*,\ \text{where}\ A*=A-dc \qquad (12)$$

we obtain from equation (9) a discrete-time sinusoidal function as the output signal:

$$Y(z) = \frac{A*(z^2 - \cos\theta_0 z)}{z^2 - 2\cos\theta_0 z + 1} \qquad (13)$$

This output signal Y(z) has complex-conjugate poles at $$z=\exp(\pm j\theta_0), \qquad (14)$$

and a unit sample response $$y(n)=A*\cos(n\theta_0),\ n\geq 0 \qquad (15)$$

Thus the impulse response of the second-order system with complex-conjugate poles on the unit circle is a sinusoidal waveform.

An arbitrary initial offset $\phi_0$ can be realized, namely, $$y(n)=A*\cos(\theta_0 n+\phi_0) \qquad (16)$$

by choosing the initial values:

$$x_1(0)=A*\cos(\theta_0\phi_0) \qquad (17)$$

$$x_2(0)=A*\cos(\phi_0). \qquad (18)$$

The output frequency of the digital oscillator ($\theta_0$) could be altered by changing the coefficient $\alpha$ in (11) and the initial value in (17). The above derived formulas show that any real-valued sinusoidal oscillator signal can be generated by the second-order structure shown in FIG. 6. The initial phase offsets of the digital oscillator are 0 for the ramp down and π for the ramp up. The initial values of state variables $x_1(n)$ and $x_2(n)$ for these phase offsets are calculated from equations 17 and 18.

Hence, for the failing ramp ($\phi_0=0$) the initial values are $x_1(0)=(A-dc)\cos(\theta_0)$ $x_2(0)=(A-dc)$.

For the rising ramp ($\phi_0=\pi$) the initial values are $x_1(0)=-(A-dc)\cos(\theta_0)$ $x_2(0)=-(A-dc)$.

The initial values for the raising ramp are negation of the initial values for the falling ramp.

The output sequence y(n) of the ideal oscillator is the sampled version of a pure sine wave. The angle $\theta_0$ represented by the oscillator coefficient is given by $$\theta_0=2\pi f_0 T, \tag{19}$$

where $f_0$ is the desired frequency in cycles per second. In actual implementation, the multiplier coefficient $2\cos\theta_0$ is assumed to have b+2 bits. In particular, one bit is for the sign, one bit for the integer part, and b bits for the remaining fractional part in fixed-point number representation. Then the largest value of the coefficient $2\cos\theta_0$ which can be represented is $(2-2^{-b})$. This value of the coefficient gives the smallest value of $\theta_{min}$ which can be implemented by a direct form digital oscillator using b bits:

$$\theta_{min} = \cos^{-1}\left[\frac{1}{2}(2-2^{-b})\right]. \tag{20}$$

Therefore, the smallest frequency which the oscillator can generate is $$f_{min} = \frac{\theta_{min}}{2\pi} f_{clk}, \tag{21}$$

where $f_{clk}$ is the clock frequency (sampling frequency).

As an example, let b=25 bits. The largest oscillator coefficient ($2\cos\theta_0$) is 67108863/33554432, then $\theta_{min}=\cos^{-1}(67108863/67108864)\approx 0.00017263$. If clock frequency $f_{clk}$ is 52 MHz and b=25, then $f_{min}\approx 1.43$ kHz.

The ramp duration could be altered by changing the output frequency of the digital oscillator. During the ramp period the phase change in equations 5 and 6 is π, and therefore the required output frequency is $$f_0 = \frac{1}{2T_r}. \tag{22}$$

The smallest frequency $f_{min}$ should be below $f_0$. For $T_r$32 14 μs, $f_0\approx 35.71$ kHz.

Referring to FIG. 6 the cosine term in formulas 5 and 6 is implemented by the sinusoidal oscillator, which solves the second order difference equation. Value A* of the digital oscillator amplitude is selected to be same as A−dc, where A is the desired nominal power level of the ramp signal and dc is the level from which the rising ramp starts and to which the falling ramp ends. The initial phase offsets of the digital oscillator are 0 when forming the ramp down, and π when forming the ramp up. Hence, it is worth noting, that by choosing the value A−dc from a table of values the desired power level of the digital ramp signal is selected. By setting the initial phase offset of the digital oscillator to 0, the oscillator generates the ramp down signal, and by setting the initial phase offset to π, the oscillator generates the ramp up signal.

The digital output signal of the oscillator is $(A-dc)\cos(n\theta_0+\phi_0)$. However, in order to fulfill requirements of formulas 5 and 6, a factor A+dc should be added up said digital output signal. That's why the output signal and a signal having the value A+dc are applied to the two-input adder 68 (see FIG. 6). By adding, a ramp signal is produced with an amplitude which is twice as high as required. For that reason the ramp signal is applied to scaler 66, which performs binary shift $2^{-1}$ to the incoming digital ramp signal. The scaler can be implemented with wiring.

Finally, the digital ramp signal is fed to block 67. The purpose of that block is to maintain the achieved power level of the ramp signal exactly at the desired nominal level A during the modulation period. Block 67 can be formed by a multiplexer (MUX), the output signal of which is locked to the input signal during the rise and fall periods of the ramp. Hence, when the ramps start to rise, selection signal SEL holds the MUX in a state which allows a signal incoming from scaler 66 to appear at the output port of the MUX. After the rising ramp has reached nominal power level A, selection signal SEL changes the state. In response to the change, a signal fed back from the output port to the input port of the multiplexer is directed again to the output port, whereby signal OUT remains constant. Accordingly, when the falling ramp starts, selection signal SEL changes its state again, whereupon the falling ramp is directed to the output port of MUX a 67.

Power control is realized by scaling the ramp curve within the oscillator. The amplitude of the sinusoidal is controlled by factor A. For example, the downlink dynamic power control in GSM 900/DCS 1800 uses 16 power levels with 2 dB separation. The power control range is 0 . . . −32 dB, where 0 dB level is the nominal maximum power. The additional 2 dB range is reserved for gain stabilization of the transmitter analog parts. Furthermore, power control fine tuning step (0.25 dB) is introduced for this purpose. Therefore, the range of the initial amplitude value A* is from 0.0251 to 0.999.

If the ramp time is variable, then a fully parallel multiplier is needed. For applications with fixed ramp time, a fully parallel multiplier is not required, and it would indeed be a waste of silicon area. Multiplication by a fixed binary number can be accomplished with N−1 adders, where N is the number of nonzero bits in the coefficient.

If the clock frequency is 52 MHz, the. output frequency of the oscillator is 35.71 kHz and b is 25, then the coefficient $2\cos(2\pi f_0/f_{clk})$ is 1.99998137757162 $(01111111111111110110001111)_2$. This requires 22 adders.

Figure 7:
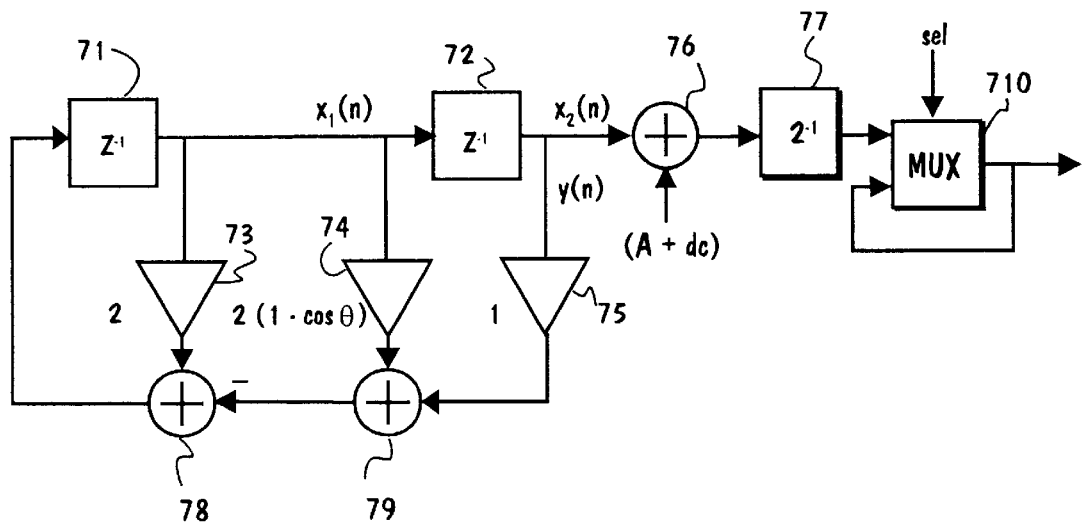
FIG. 7 is another embodiment of the invented ramp generator.

FIG. 7 shows the block diagram of a modified ramp generator and output power controller. In comparison with FIG. 6, it includes an extra two-input adder 78 and block 73, which multiplies variable x1(n) with coefficient 2. In blocks 74 and 75 the multiplication coefficients are 2(1−cos θ) and 1, respectively. In order to reduce the hardware complexity of the direct-form digital oscillator, we can write:

$$2\cos(\theta)=2-2^{-b1}\lfloor 2^{b1}(2-2\cos(\theta))\rfloor, \tag{23}$$

where $$b1 = \left\lceil \log_2\frac{1}{2(1-\cos\theta)} \right\rceil, \tag{23}$$

and [r] is the smallest integer greater than or equal to r. The coefficient $(2-2\cos(2\pi f_0/f_{clk}))$ is 0.00001862

(0000000000000000001001110000)2. The total number of adders to implement the coefficient 2 $\cos(2\pi f_0/f_{clk})$ is reduced from 22 to 4. The coefficient is formed by multiplying the small fraction $(2-2\cos(2\pi f_0/f_{clk}))$ by the factor $2^{b1}$, where b1 is 16. This reduces hardware complexity by reducing the maximum word length needed in adders. The output of the adders must be multiplied by $2^{-b1}$, to keep the overall gain unchanged. The number of adders could be reduced further using the Canonic Signed Digit (CSD) numbers.

The error at the invented ramp generator output consists of two components $$e(n)=e_1(n)+e_2(n), \quad (24)$$

where $e_1(n)$ is the error due to the ramp generator output quantization, $e_2(n)$ is the error that has been accumulated as a result of the recursive computations in the digital oscillator.

The bounds for $e_1(n)$ are given by $$-2^{-c} < e_1 \leq 0, \quad (25)$$

for truncation and $$-2^{-c}/2 < e_1 \leq 2^{-c}/2, \quad (26)$$

for rounding and c is the fractional bits in the ramp generator and power level controller.

In the digital oscillator, besides the zero-input response $y(n)$ of the second-order system, we get a zero-state response $y_{err}(n)$ due to to the random sequence $e_2(n)$ acting as an input signal. From equation (7) is obtained $$y(n+2)=\alpha y(n+1)-y(n)+e_2(n+2), \quad (27)$$

and by z transformation $$Y(z)=Y_{ideal}(z)+Y_{err}(z), \quad (28)$$

with $Y_{ideal}(z)$ due to (9). The z transform of the output error $y_{err}(n)$ is given by $$Y_{err}(z) = \frac{z^2 E_2(z) - z^2 e_2(0) - z e_2(1)}{z^2 - 2\cos\theta_0 z + 1}, \quad (29)$$

with $E_2(z)$ being the z transform of the quantization error signal $e_2(n)$. Transforming $Y_{err}(z)$ back into the time domain results in an output error sequence $$y_{err}(n) = \frac{1}{\sin\theta_0} \sum_{k=2}^{n} e_2(k)\sin(\theta_0(n-k+1)), \text{ for } n \geq 2, \quad (30)$$

when $e_2(0)$ and $e_2(1)$ are assumed to be zero.

Figure 8:
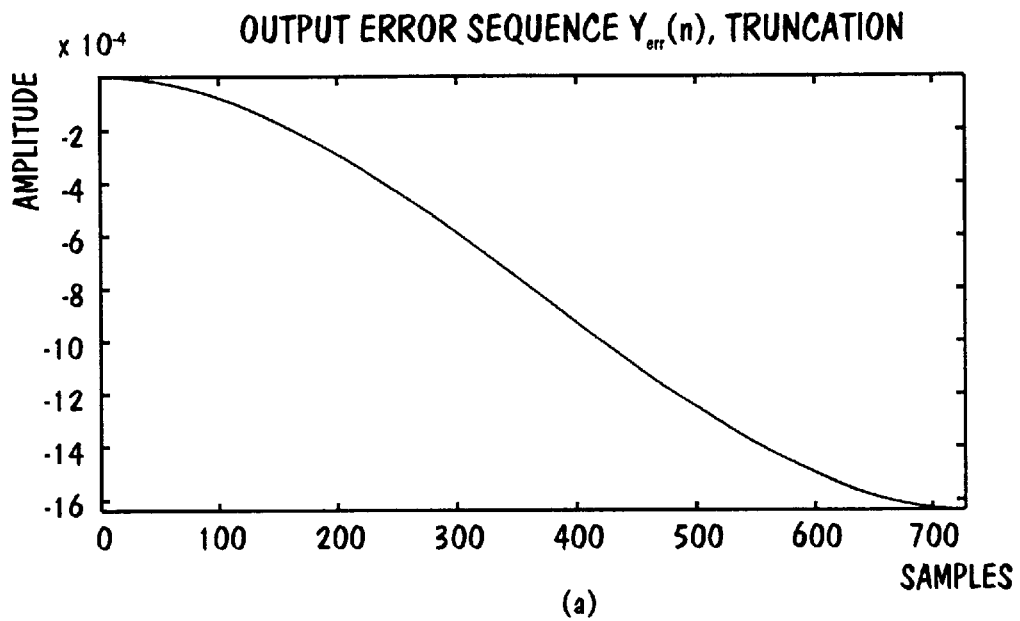
FIG. 8A shows output error when truncation is used.
FIG. 8B shows output error when rounding is used.
Figure 8:
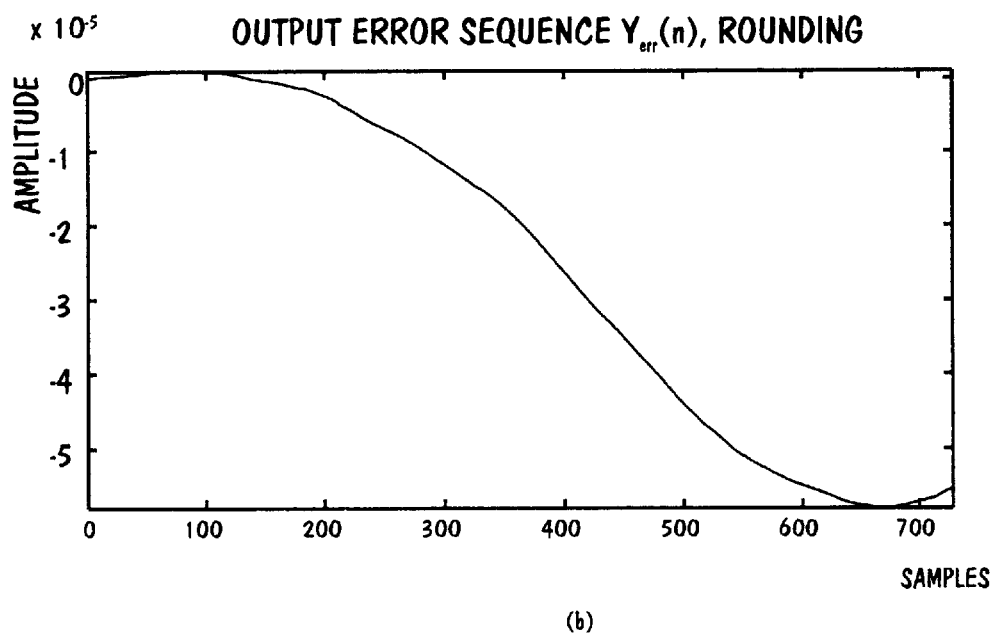

Equation (30) shows that output error is inversely proportional to $\sin\theta_0$. Thus output error increases with decreasing digital oscillator frequency. If truncation is used, the right-hand side of equation (30) is negative since $e_2(k)$ is negative, (see equation (25)) and $\sin(\theta_0(n-k+1))$ is positive, because the digital oscillator generates only half of the sine wave period. Therefore truncation results in very high output errors as shown in FIG. 8A.

The fact that error is a deterministic signal forces us to investigate the worst case, which corresponds to the case where every truncation suffers from the maximum absolute error value. Thus the upper limit for the error becomes $$y_{max\,err}(M) = \frac{e_{max}}{\sin\theta_0} \sum_{k=2}^{M} \sin(\theta_0(M-k+1)), \quad (31)$$

$$\approx \frac{-2^{-b}}{\sin\theta_0 \sin(\theta_0/2)} \approx \frac{-2^{-b+1}}{\theta_0^2},$$

where $e_{max}=-2^{-b}$ is the worst case truncation error, b is fractional bits in the digital oscillator, $0<\theta_0<<1$, $M=\lceil\pi/\theta_0\rceil$, and $\lceil r \rceil$ is the smallest integer greater than or equal to r.

FIG. 8B shows the error if rounding is used. The $e_2(k)$ gets positive and negative values, so the output error sequence gets lower values than in the case of truncation. Simulations indicate the accumulated error is below output quantization error when rounding is used, b is 25, and c is 12.

Figure 9:
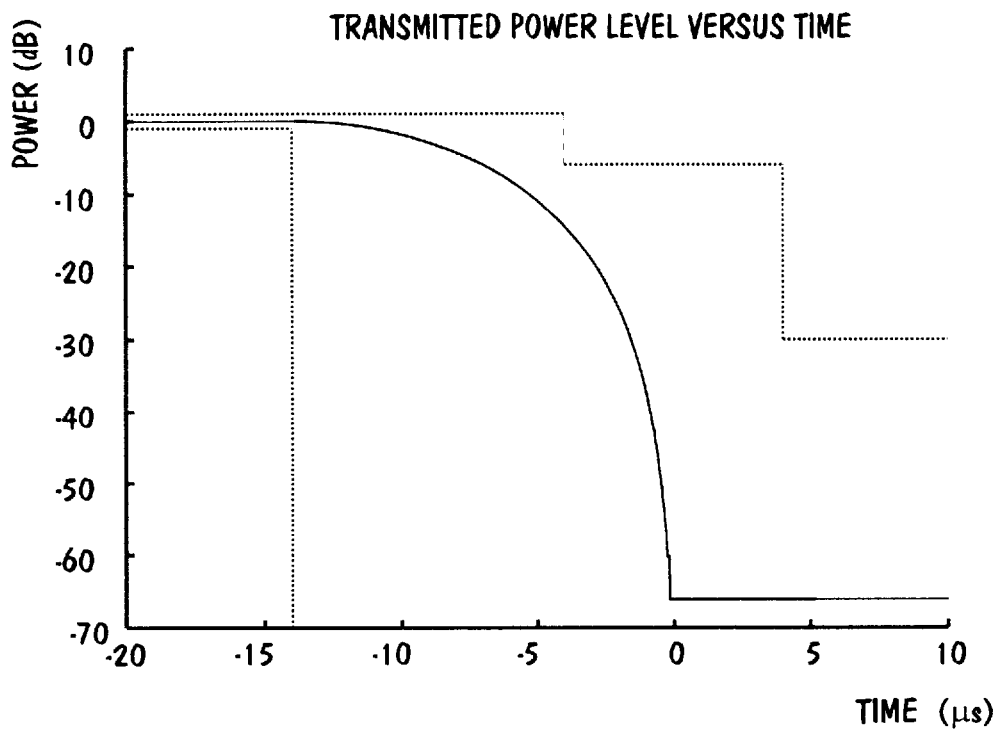
FIG. 9 depicts a ramp down profile.
Figure 10:
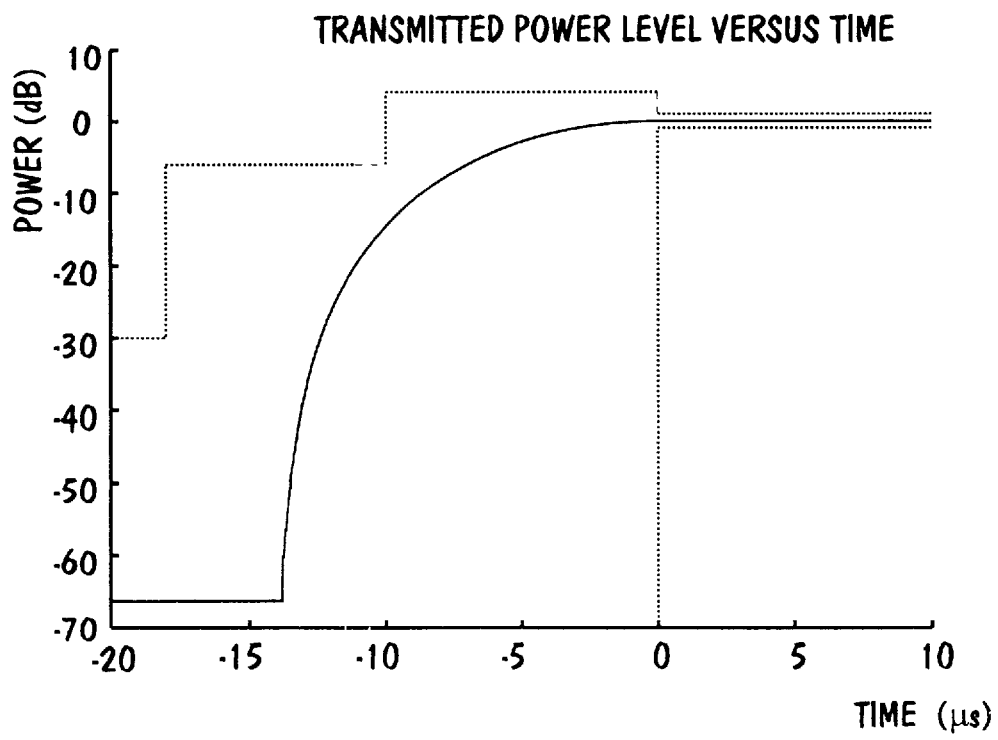
FIG. 10 depicts a ramp up profile.

FIG. 9 and FIG. 10 show ramp up and ramp down profiles for transmitted time slots. Dashed lines show the time mask for the burst by burst power ramping. The curves fully satisfy the GSM 900/DCS 1800 masks. The power measured due to switching transients, which determines allowed spurious responses originated from the power ramping before and after the bursts, shall not exceed the limits shown in table I. The exact limits are given in GSM specification 05.05. The simulated power levels are well below the limits as shown in Table I.

TABLE I

Spectrum due to switching transients

| Offset (kHz) | Maximum power limit (dBc) | | Simulated Maximum Power (dBc) with Raised Cosine/Sine Window | Simulated Maximum Power (dBc) with Blackman Window |
| --- | --- | --- | --- | --- |
| | GSM 900 | DCS 1800/1900 | | |
| 400 | −60 | −53 | −71.20 | −71.28 |
| 600 | −70 | −61 | −78.09 | −79.69 |
| 1200 | −77 | −69 | −84.97 | −86.35 |
| 1800 | −77 | −69 | −86.23 | −89.13 |

The oscillator can be implemented in various ways. The fixed coefficient multiplier in the sinusoidal oscillator in FIG. 5 could be replaced by a fully parallel multiplier, allowing the output frequency of the sinusoidal oscillator changed and the ramp duration time to be variable.

The ramp generator and power level controller according to the invention can also support a Blackman window.

Figure 11:
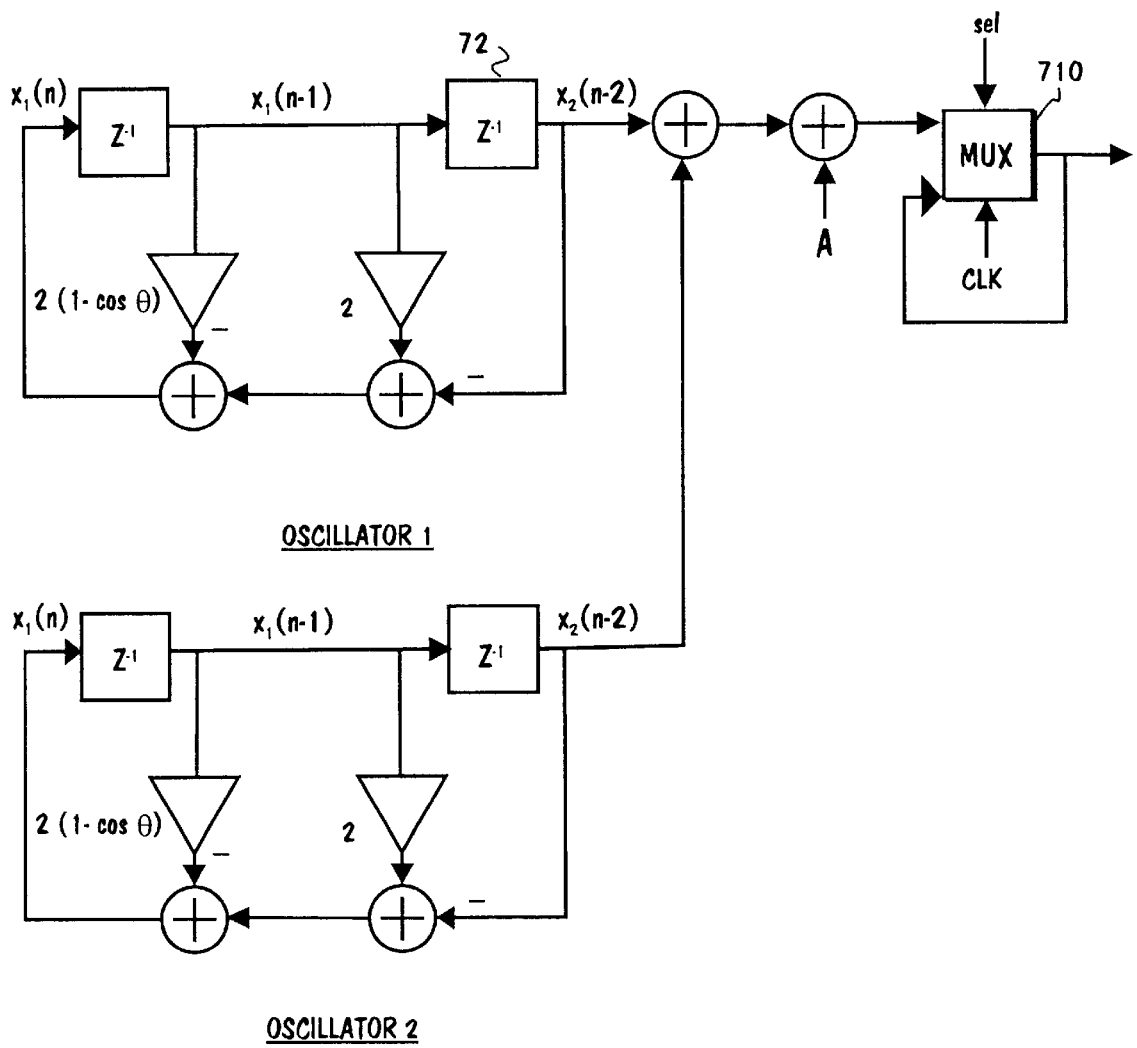
FIG. 11 shows a ramp generator adapted to Blackman window.

FIG. 11 shows a ramp generator adapted to Blackman window. In that window equations (5) and (6) presented previously are of the form:

$$0.42A + 0.5A\cos\left(\frac{\pi*t}{T_r}\right) + 0.08A\cos\left(\frac{2\pi*t}{T_r}\right) \quad (32)$$

for the Blackman falling ramp, and $$0.42A + 0.5A\cos\left(\frac{\pi*t}{T_r} + \pi\right) + 0.08A\cos\left(\frac{2\pi*t}{T_r}\right) \quad (33)$$

for the Blackman rising ramp.

The frequency response of the burst signal with Blackman window is $$W(f) = \qquad (34)$$

$$V \sum_{n=-\infty}^{\infty} M(f - f_C - nf_g) \left[ \frac{(\tau - T_r)\text{sinc}(nf_g(\tau - T_r))\cos(\pi T_r n f_g)}{1 - (2T_r n f_g)^2} - \frac{4T_r \text{sinc}(nf_g T_r)\cos(\pi n f_g(\tau - T_r))}{25(1 - (T_r n f_g)^2)} \right]$$

where V is a proportional constant. This equation gives more attenuation of switching transients than raised cosine/sine switching (2).

The extra cosine term in equations (32) (33) requires one more digital oscillator in the ramp generator and power level controller as shown in FIG. 11.

Recursive parts (see FIGS. 7 and 11) of the ramp generator and output power level controller determine the maximum sample rate. The clock frequency of the IF modulator is high so the multiplier is required to be fast. The idea of the implemented poly-phase ramp generator structure is to generate the desired sinusoidal oscillating signal with two oscillators, one of which spawns the odd samples and the other the even samples. This way both the odd and even oscillators can be operated at half the clock frequency. This means that four oscillators are needed to generate Blackman ramps.

Figure 12:
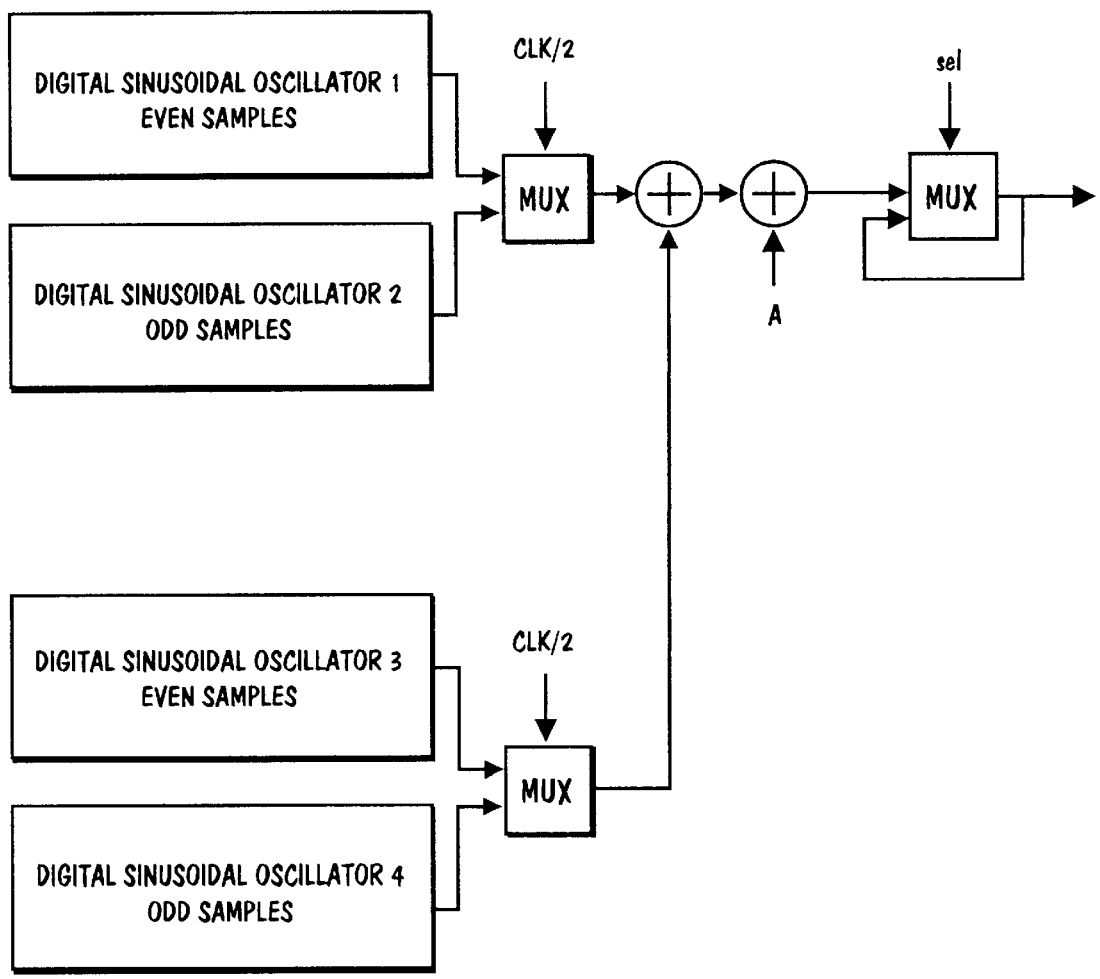
FIG. 12 depicts a block diagram of another ramp generator adapted to Blackman window.

FIG. 12 depicts a structure for generating Blackman ramps with four oscillators. The odd and even oscillator outputs are alternately selected with a 2-to-1 MUX, the select signal of which is the divided clock. The initial values of the poly-phase ramp generator are calculated by choosing first the same initial values as in the normal case and calculating the next two values using the difference equation (7) and choosing the odd samples for the odd oscillators and the even samples for the even oscillators.

What is claimed is:

1. A method of producing a curve in a digital ramp generator, the curve comprising, a rising ramp starting from a base power level dc and ending at a nominal power level A, the rising ramp being in the form $$(A - \text{dc})\left(\sin\left(\frac{\pi t}{2T_r}\right)\right)^2 + \text{dc},$$

where $T_r$ is the ramp time, a falling ramp starting from the nominal power level A and ending at the base level dc, the falling ramp being in the form $$(A - \text{dc})\left(\cos\left(\frac{\pi t}{2T_r}\right)\right)^2 + \text{dc},$$

where $T_r$ is the ramp time a flat portion between the rising ramp and the falling ramp at the nominal power level, characterized in steps of:

using trigonometric identities the form of the rising ramp is transformed into form $$\frac{1}{2}\left((A + \text{dc}) + (A - \text{dc})\cos\left(\frac{\pi t}{T_r} + \pi\right)\right),$$

using trigonometric identities the form of the falling ramp is transformed into form $$\frac{1}{2}\left((A + \text{dc}) + (A - \text{dc})\cos\left(\frac{\pi t}{T_r}\right)\right),$$

and providing a digital sinusoidal oscillator for computing the cosine terms.

2. A method as in claim 1, further comprising the step of realizing the digital sinusoidal oscillator by a second order direct-form recursive structure implementing the second-order difference equation of state variables:

$$x_2(n+2) = 2\cos(2\pi f_0/f_{CLK})x_2(n+1) - x_2(n),$$

where $f_0$ is the digital sinusoidal oscillator frequency and $f_{CLK}$ is the sampling frequency.

3. A method as in claim 1, further comprising the step of providing an adder for adding the value A+dc and the output signal of the digital sinusoidal oscillator.

4. A method as in claim 3, further comprising the step of providing a scaler for scaling the output signal from the adder by the factor ½.

5. A method as in claim 1, further comprising the step of providing means for sustaining the amplitude of the curve at the nominal power level A between the rising ramp and the falling ramp.

6. A digital ramp generator including means for producing a curve comprising, a rising ramp having the shape of a raised sine curve, the rising ramp starting from a base power level and ending at a nominal power level, a falling ramp having the shape of a raised cosine curve, the falling ramp starting from the nominal power level and ending at the base level, a flat portion between the rising ramp and the falling ramp at the nominal power level, wherein said means for producing the rising ramp and the falling ramp of the curve comprise a digital sinusoidal oscillator generating the rising ramp in the form $$(A - dc)\cos\left(\frac{\pi t}{T_r} + \pi\right),$$

and the falling ramp in the form $$(A - dc)\cos\left(\frac{\pi t}{T_r}\right),$$

where $T_r$ is the ramp time, A is the nominal power level, and dc is the base power level; and the digital sinusoidal oscillator is realized by a second order direct-form recursive structure, within which the cosine terms are computed and which implements the second-order difference equation of state variables:

$$x_2(n+2) = 2\cos(2\pi f_0/f_{CLK})x_2(n+1) - x_2(n),$$

where $f_0$ is the digital sinusoidal oscillator frequency and $f_{CLK}$ is the sampling frequency.

7. A digital ramp generator as in claim 6, wherein a second order direct-form recursive structure comprises a first digital delay element producing state variable $x_2(n+1)$ and a second digital delay element producing state variable $x_2(n)$, the delay elements being connected in series, a first digital two-input adder producing state variable $x_2(n+2)$ for applying to the input of the first delay element, a first digital multiplier for multiplying state variable $x_2(n+1)$ obtained from the output of the first delay element by factor $2\cos(2\pi f_0/f_{CLK})$, the output of the first multiplier being connected to one input of the digital two-input adder, a second digital multiplier for multiplying state variable $x_2(n)$ obtained from the output of the second delay element by factor $-1$, the output of the second multiplier being connected to another input of the digital two-input.

8. A digital ramp generator as in claim 7, wherein the initial value of the state variable $(x_2(n))$ at the output of the second delay element is A−dc and the initial value of the state variable $x_2(n+1)$ at the input of the second delay element (62) is $(A-dc)\cos(2\pi f_0/f_{CLK})$, wherein the unit sample response y(n) of the second order direct-form recursive structure is a digital sinusoidal equal to $(A-dc)\cos(nx2\pi f_0/f_{CLK})$.

9. A digital ramp generator as in claim 7, wherein the initial value of the state variable $x_2(n)$ at the output of the second delay element is $(A-dc)\cos(\phi_0)$ and the initial value of the state variable $x_2(n+1)$ at the input of the second delay element is $(A-dc)\cos(2\pi f_0/f_{CLK}+\phi_0)$, where $\phi_0$ is an arbitrary initial offset, wherein the unit sample response y(n) of the second order direct-form recursive structure is a digital sinusoidal equal to $(A-dc)\cos(nx2\pi f_0/f_{CLK}+\phi_0)$.

10. A digital ramp generator as in claim 6, wherein means for producing a curve further comprises a second digital two-input adder, to one input of which is applied the output signal from the digital sinusoidal oscillator and to another input of which is applied a constant having value A+dc, wherein value A determines the nominal power level of the ramps.

11. A digital ramp generator as in claim 10, wherein the output from the second digital two-input adder is connected to a scaling element, which scales the output signal from the adder so that the maximum power level is nominal power level A.

12. A digital ramp generator as in claim 10, wherein means for producing a curve further comprises a controllable holding element, which feeds directly to its output the rising ramp and the falling ramp obtained from the scaling element, but holds the power level of its output signal at nominal value A between the rising ramp and the falling ramp, thus forming the flat portion between the rising ramp and the falling ramp.

13. A digital ramp generator as in claim 6, wherein in the second-order difference equation of state variables the term $2\cos(2\pi f_0/f_{CLK})$ is rewritten to form $$2 - 2^{-b1}[2^{b1}(2 - \cos(2\pi f_0/f_{CLK}))],$$

where $$b1 = \left[\log_2 \frac{1}{2(1-\cos(2\pi f_0/f_{CLK}))}\right]$$

wherein the state variable $x_2(n+1)$ is multiplied by two parallel multipliers (73, 74) before adding.

14. A digital ramp generator as in claim 6, wherein the ramp generator is adapted to Blackman window of the form $$0.42A + 0.5A\cos\left(\frac{\pi *t}{T_r}\right) + 0.08A\cos\left(\frac{2\pi *t}{T_r}\right)$$

for the falling ramp, and $$0.42A + 0.5A\cos\left(\frac{\pi *t}{T_r}+\pi\right) + 0.08A\cos\left(\frac{2\pi *t}{T_r}\right)$$

for the rising ramp.

* * * * *